United States Patent
Lee et al.

(10) Patent No.: US 9,812,800 B2
(45) Date of Patent: Nov. 7, 2017

(54) CONDUCTIVE CONNECTING MEMBER AND DISPLAY DEVICE INCLUDING THE SAME

(71) Applicant: SAMSUNG DISPLAY CO., LTD., Yongin-si, Gyeonggi-do (KR)

(72) Inventors: Cheong Hun Lee, Asan-si (KR); Seung-Won Kuk, Cheonan-si (KR); Chung Hui Lee, Cheongju-si (KR); Sang Hyuk Kim, Seoul (KR); Yong Nam Shin, Asan-si (KR); Seon Jeong Yun, Daegu (KR)

(73) Assignee: Samsung Display Co., Ltd. (KR)

( * ) Notice: Subject to any disclaimer, the term of this patent is extended or adjusted under 35 U.S.C. 154(b) by 107 days.

(21) Appl. No.: 14/883,478

(22) Filed: Oct. 14, 2015

(65) Prior Publication Data
US 2016/0322724 A1  Nov. 3, 2016

(30) Foreign Application Priority Data
Apr. 29, 2015 (KR) ........................ 10-2015-0060865

(51) Int. Cl.
*H05K 1/00* (2006.01)
*H01R 12/77* (2011.01)
(Continued)

(52) U.S. Cl.
CPC ....... *H01R 12/771* (2013.01); *G02F 1/13452* (2013.01); *G02F 1/13458* (2013.01); *H01L 23/49572* (2013.01); *H01L 2224/50* (2013.01); *H01L 2225/107* (2013.01); *H05K 1/028* (2013.01); *H05K 1/0277* (2013.01); *H05K 1/0283* (2013.01); *H05K 1/118* (2013.01);
(Continued)

(58) Field of Classification Search
CPC ..... H05K 2201/05; H05K 2201/10681; H05K 1/0277; H05K 1/028; H05K 1/0283; H05K 1/147; H05K 1/189; H05K 1/118; H05K 1/148; H05K 3/4691; H01L 2224/50; H01L 2225/107; H01L 23/49572; G02F 1/13452; G02F 1/13458
USPC ........................ 361/749, 784, 785, 789, 791; 349/149–152; 174/254
See application file for complete search history.

(56) References Cited

U.S. PATENT DOCUMENTS 5,434,362 A * 7/1995 Klosowiak ............. H05K 1/028
                                                        174/254
2005/0237467 A1* 10/2005 Takaishi .............. G02F 1/13452
                                                        349/149
(Continued)

FOREIGN PATENT DOCUMENTS

KR   10-0821054 B1   4/2008
KR   10-1319543 B1   10/2013
(Continued)

*Primary Examiner* — Binh Tran
(74) *Attorney, Agent, or Firm* — Innovation Counsel LLP

(57) ABSTRACT

An exemplary embodiment provides a conductive connecting member, and a display device including the same, that includes a flexible elongated body and terminals formed at opposite ends of the body to be electrically connected to the body, wherein the body may include terminal areas in which the terminals are formed and a central area disposed between the terminal areas, and wherein two or more recess portions may be formed in edges of the body within the central area of the body.

10 Claims, 9 Drawing Sheets

(51) Int. Cl.
*H05K 5/00* (2006.01)
*G02F 1/1345* (2006.01)
*H05K 1/02* (2006.01)
*H05K 1/11* (2006.01)
*H01L 23/495* (2006.01)
*H05K 1/14* (2006.01)
*H05K 3/46* (2006.01)
*H05K 1/18* (2006.01)

(52) U.S. Cl.
CPC ............ *H05K 1/147* (2013.01); *H05K 1/189* (2013.01); *H05K 3/4691* (2013.01); *H05K 2201/05* (2013.01); *H05K 2201/10681* (2013.01)

(56) References Cited

U.S. PATENT DOCUMENTS

2011/0164005 A1* 7/2011 Miyata ................ G02F 1/13452
345/204
2014/0092356 A1 4/2014 Ahn et al.
2014/0354900 A1* 12/2014 Qian ..................... G06F 1/1658
349/12

FOREIGN PATENT DOCUMENTS

| KR | 10-1321750 B1 | 10/2013 |
| KR | 10-2014-0025220 A | 3/2014 |
| KR | 10-2014-0043968 A | 4/2014 |
| KR | 10-2014-0050381 A | 4/2014 |
| KR | 10-2014-0091100 A | 7/2014 |

* cited by examiner

CONDUCTIVE CONNECTING MEMBER AND DISPLAY DEVICE INCLUDING THE SAME

RELATED APPLICATIONS

This application claims priority to, and the benefit of, Korean Patent Application No. 10-2015-0060865 filed in the Korean Intellectual Property Office on Apr. 29, 2015, the entire contents of which are incorporated herein by reference.

BACKGROUND

1. Field

The described technology relates generally to a conductive connecting member and a display device including the same, and more particularly, to a flexible conductive connecting member, such as a flexible printed circuit board is (FPCB), a flat flexible cable (FFC) and the like, and a display device including the same.

2. Description of the Related Art

Various display devices, such as a flat panel display that can be a liquid crystal display, an electric field emission display, a plasma display panel, an organic light emitting display, and the like, have been developed. In the case of small and medium-sized display devices, a flexible display device that is stretchable or foldable is being researched and developed to maximize the portability thereof. In the case of large-sized display devices, a curved display device is being researched and developed to enhance viewer immersion and make the image more realistic.

The above-mentioned display devices generally include a driver that supplies and controls an electrical signal, and a display panel that is connected to the driver and displays an image. A conductive connecting member such as an FPCB, an FFC, and the like is often used for electrically connecting the driver and the display panel.

For example, a curved display device may have a driving circuit substrate that is divided into two or more driving circuit substrates in order to conform to the curvature of the curved display panel. In this case, an FPCB or FFC is used to electrically connect the adjacent driving circuit substrates to each other.

However, since the shape of the curved display panel may not precisely match the shapes of the driving circuit substrates, stress caused by coupling the curved display panel with the driving circuit substrates is generated in both the display panel and in the FPCB or FFC. In particular, the FPCB or FFC may be damaged due to this stress, and when the FPCB or FFC is not made to be flexible to prevent damage, this stress may also damage the display panel.

As such, the stress generated by the difference in shape between the display panel and the driving circuit substrate may result in a flexible display device that is continually stretched and folded.

The above information disclosed in this Background section is only to enhance the understanding of the background of the described technology and therefore it may contain information that does not form the prior art that is already known in this country to a person of ordinary skill in the art.

SUMMARY

Embodiments of the invention provide a conductive connecting member and a display device including the same that better dissipate stress generated by coupling between a display panel and a driving circuit substrate.

An exemplary embodiment provides a conductive connecting member including: a flexible, elongated body; and terminals formed at opposite ends of the body to be electrically connected to the body, wherein the body may include terminal areas in which the terminals are formed and a central area disposed between the terminal areas, and wherein two or more recess portions may be formed in edges of the body within the central area of the body.

The recess portions may include two or more first recesses formed in a first edge of the body, and two or more second recesses formed in a second edge of the body, the second edge being opposite to the first edge.

Ones of the first recesses may be disposed in alternating manner with ones of the second recesses along the central area.

The recess portions may comprise recesses in edges of the body, and at least one recess may have a rounded end.

At least two of the recesses may have a same width.

Intervals between adjacent recesses may be the same.

The terminal areas of the body may each form an at least approximate U-shape.

The body may form a substantially linear shape with the central area and the terminal areas extending substantially in the same direction.

A circuit pattern may be printed on the body, and the circuit pattern may be electrically connected to the terminals.

The body may include a conductive wire and a protective member covering the conductive wire, and opposite ends of the conductive wire may be electrically connected to the terminals.

Another embodiment provides a display device including: a display panel that is flexible and is constructed to display an image; a driver that includes two or more driving circuit substrates and is disposed around the display panel to drive the display panel; a flexible drive connector that electrically connects the display panel and the driver; and a conductive connecting member that electrically connects adjacent driving circuit substrates to each other, wherein the conductive connecting member may include a flexible elongated body; and terminals formed in opposite ends of the body to be electrically connected to the body, wherein the body may include terminal areas in which the terminals are formed and a central area disposed between the terminal areas, and two or more recess portions may be formed in edges of the body within the central area of the body.

The display panel may be a curved display panel curved in a predetermined direction, and the two or more driving circuit substrates may be formed to curve corresponding to a curvature of the curved display panel.

The driving circuit substrates may include connectors sized and arranged to receive the terminals.

The connectors may be oriented substantially parallel to a lengthwise direction of the driving circuit substrate.

The connectors may be oriented substantially perpendicular to the lengthwise direction of the driving circuit substrate.

According to an embodiment, since flexibility of a central area of a conductive connecting member according to a first exemplary embodiment is increased by a recess portion, stresses within the conductive connecting member are reduced and forces exerted by the member are thereby also reduced, thus helping to prevent release of a connector from its terminal, and helping prevent damage to solder joints between the terminal and driving circuit is substrate.

DETAILED DESCRIPTION

Figure 1:
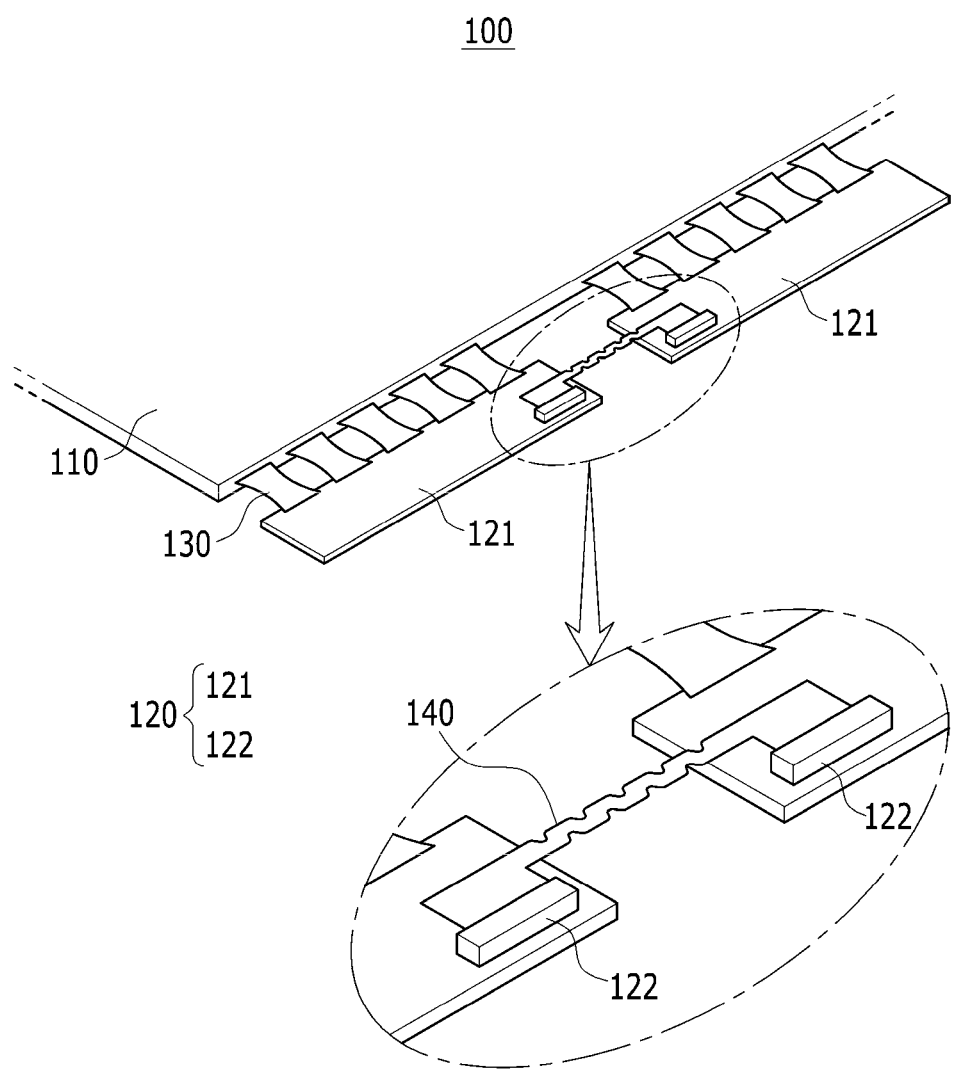
FIG. 1 is a perspective view of a display device including a conductive connecting member according to a first exemplary embodiment.

Hereinafter, an exemplary embodiment will be described in detail with reference to the attached drawings such that the described technology can be easily put into practice by those skilled in the art. As those skilled in the art would realize, the described embodiments may be modified in various different ways, all without departing from the spirit or scope of the described technology. The drawings and description are to be regarded as illustrative in nature and not restrictive. Like reference numerals designate like elements throughout the specification.

Further, in various exemplary embodiments, since like reference numerals designate like elements having the same configuration, a first exemplary embodiment is representatively described, and in other exemplary embodiments only configurations that differ from the first exemplary embodiment will be described.

Parts that are irrelevant to the description will be omitted to more clearly describe the described technology, and the same or similar constituent elements will be designated by the same reference numerals throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

In the drawings, the thickness of layers, films, panels, regions, etc., are exaggerated for clarity. The various Figures are thus not to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

All numerical values are approximate, and may vary. All examples of specific materials and compositions are to be taken as nonlimiting and exemplary only. Other suitable materials and compositions may be used instead.

A configuration of a display device including a conductive connecting member according to a first exemplary embodiment will be described with reference to FIGS. 1 to 6.

FIG. 1 is a perspective view of a display device including a conductive connecting member according to a first exemplary embodiment.

Referring to FIG. 1, a display device 100 according to a first exemplary embodiment includes a display panel 110, a driver 120, a drive connector 130, and a conductive connecting member 140.

The display device 100 includes a display area in which an image is displayable, and a non-display area that is disposed around the display area and in which wires are disposed.

The display device 100 may be a variety of display devices that display an image. Examples include a liquid crystal display configured to include a backlight unit, a thin film transistor array substrate, a liquid crystal layer, and an alignment layer; or an organic light emitting device configured to include a thin film transistor array substrate, an organic light emitting element, and an encapsulation layer.

The display panel 110 may include a quadrangular base substrate (not shown) formed of an insulation material such as glass, quartz, ceramic, metal, plastic, and the like. Since the base substrate (not shown) of the present exemplary embodiment includes a flexible material such as polyimide (PI) and the like, the display panel 110 may have flexibility, by which the display panel 110 may be curved, may be completely folded or bent around one or more axes, may be stretched, or may be rolled.

The display panel 110 may be a liquid crystal panel in which a backlight unit, a thin film transistor array substrate, a liquid crystal layer, and an alignment layer are sequentially stacked on the base substrate. However, the display panel 110 is not limited thereto, and it may be an organic light emitting panel in which a thin film transistor array substrate, an organic light emitting element, and an encapsulation layer are sequentially stacked.

The driver 120 is electrically connected to the non-display area of the display panel 110 to supply external power to the display panel 110, thereby substantially controlling image display by the display panel 110. The driver 120 includes a driving circuit substrate 121 and one or more connectors 122.

The driving circuit substrate 121 is disposed on at least one side of the display panel 110 to be electrically connected to wires that are within the non-display area of the display panel 110.

In the present exemplary embodiment, the driver 120 may be divided into two or more driving circuit substrates 121 disposed along one or more sides of the panel 110, so as to disperse stress that is generated due to variations of the display panel 110, such as a variation in bending or curvature that is applied to the driver 120. That is, multiple driving circuit substrates 121 may be employed instead of a conventional single driving circuit substrate. Accordingly, damage to the driving circuit substrate 121 caused by stress generated from the display panel 110 may be minimized.

When the multiple driving circuit substrates 121 are applied to a curved large display device that is equal to or more than about 45 inches in size, since stress due to bending of the large display panel may be dispersed to, or divided between, each of the driving circuit substrates 121, thereby reducing the stresses generated within each substrate 121.

The connector 122 may be mounted on the driving circuit substrate 121 to extend lengthwise along a length direction of the driving circuit substrate 121. The connector 122 may be electrically connected to the conductive connecting member 140. A receiving groove (not shown) may be formed in the connector 122 in known manner, so that an end portion of the conductive connecting member 140 may be received.

In the present exemplary embodiment, the connectors 122 of the adjacent driving circuit substrates 121 may be electrically connected to one conductive connecting member 140. Accordingly, two or more driving circuit substrates 121 may be electrically connected to each other.

In the present exemplary embodiment, the conductive connecting member 140 is connected to the driving circuit substrates 121 through the connectors 122. However, embodiments of the invention are not limited thereto, and the member 140 may be removed according to various designs of the driving circuit. That is, instead of mounting the connector 122 on the driving circuit substrate 121, end portions of the conductive connecting member 140 may be directly soldered or otherwise electrically connected to the two adjacent driving circuit substrates 121.

The drive connector 130 electrically connects the display panel 110 and the driving circuit substrates 121, through which an image displayed by the display panel 110 and power supplied to the display panel 110 through the driver 120 are controlled. The drive connector 130 may be a typical flexible printed circuit board (FPCB), a typical flat flexible cable (FFC), or the like, but it is not limited thereto, and may instead include any one or more of various conductors to electrically connect the display panel 110 and the driver 120.

The conductive connecting member 140 electrically connects the connectors 122 formed in each of the adjacent driving circuit substrates 121, so that the driving circuit substrates 121 are electrically connected to each other.

Various conductive connecting members 140 will be further described with reference to FIGS. 2 to 6, in addition to FIG. 1.

Figure 2:
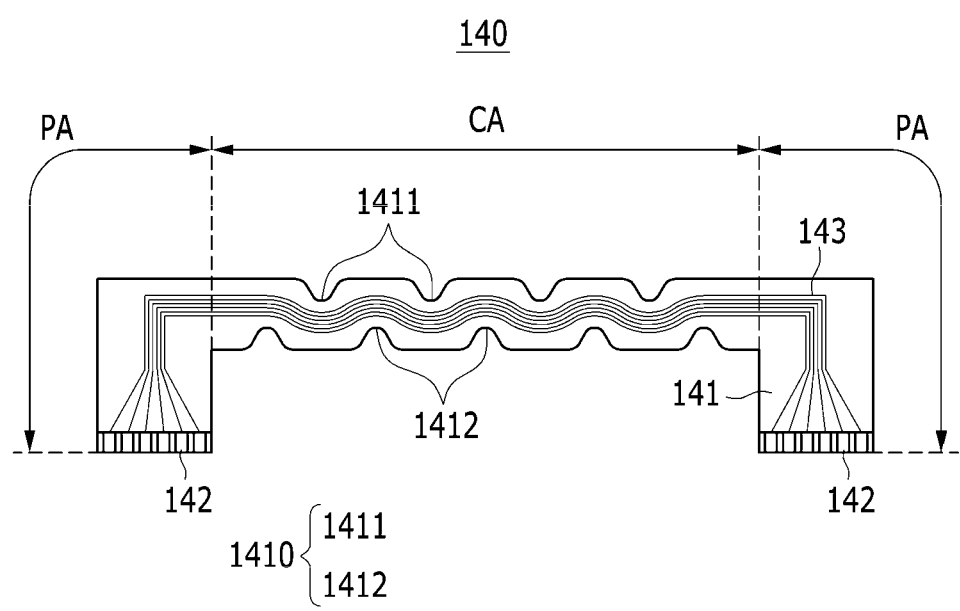
FIG. 2 is a schematic diagram of a conductive connecting member according to an exemplary embodiment.

FIG. 2 is a schematic diagram of the conductive connecting member according to the first exemplary embodiment.

According to the first exemplary embodiment, the conductive connecting member 140 is formed in a general belt shape, and it may include a flexible body 141, terminals 142 formed at opposite ends of the flexible body, and a circuit pattern 143 printed on the flexible body 141 to be electrically connected to the terminals 142. The conductive connecting member 140 according to the first exemplary embodiment may be an FPCB, but it is not limited thereto.

The body 141 includes a flexible material such as polyimide (PI), and is thereby able to be bent or curved, completely folded about one or more axes, stretched, or rolled. In the first exemplary embodiment, the body 141 includes two terminal areas (PA) in which the terminals 142 are formed, and a central area (CA) disposed between the two terminal areas (PA).

Since the two terminal areas (PA) are respectively located at opposite ends of the central area (CA), the body 141 may be formed in a U-shape when viewed as a whole. Accordingly, even when the connector 122 is mounted lengthwise along the length direction of the driving circuit substrate 121 as shown in FIG. 1, the two adjacent driving circuit substrates 121 may be electrically connected to each other.

However, the exemplary embodiment is not limited thereto, and the shape of the body 141 may be varied according to a method of mounting the connector, for example, a position at which or a direction in which the two adjacent connectors 122 are substantially mounted. The body 141 may take on any suitable shape allowing for electrical connection of adjacent substrates 121.

Figure 3:
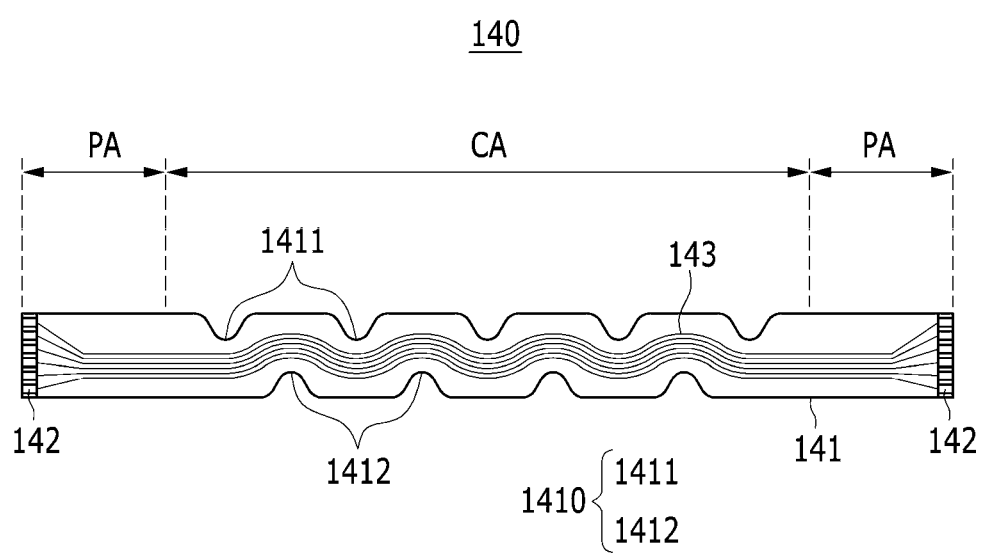
FIG. 3 is a drawing illustrating a central area of a conductive connecting member according to an exemplary variation of FIG. 2.

FIG. 3 is a drawing illustrating a central area (CA) of a conductive connecting member 140 according to an exemplary variation of FIG. 2. According to the exemplary variation of FIG. 3, the conductive connecting member 140 may be formed in a straight line (i.e. substantially linear) shape as shown in FIG. 3. That is, two terminal areas (PA) and a central area (CA) of a body 141 may be formed to extend substantially in the same direction. Particularly, when the body 141 is formed in a straight line shape (e.g., a linear shape with cutouts) as shown in FIG. 3, the two adjacent connectors 122 are respectively mounted in a direction perpendicular to the length direction of the driving circuit substrate 121 such that connectors with receiving grooves (not shown) that are disposed to face each other may be easily connected to each other.

The terminals 142 may be respectively formed at opposite ends of the body 141. Each terminal 142 includes a conductive metal pattern and is inserted into the connector 122 of the driving circuit substrate 121 or is soldered to the wire of the driving circuit substrate 121, such that the conductive connecting member 140 may electrically connect the adjacent driving circuit substrates 121.

As shown in FIGS. 2 and 3, the circuit pattern 143 is printed on a top surface of the body 141, and it may be respectively connected to the terminals 142 formed at the opposite ends thereof. Accordingly, the driving circuit substrates 121 respectively connected to the ends of the conductive connecting member 140 transmit and receive electrical signals to and from each other through the circuit pattern 143. Since the structure of the printed circuit pattern 143 is already known, a detailed description thereof will be omitted.

Two or more recess portions 1410 may be formed in edges of the body 141 within the central area (CA) along the length direction of the body 141, as shown in FIGS. 2 and 3. Particularly, when the display device 100 is flexible, the driving circuit substrates 121 may be bent, displaced, or oriented at an angle with respect to each other. Accordingly, the central area (CA) may be twisted, and when the central area (CA) is overly stiff (insufficiently flexible), excessive stresses may arise within the central area (CA). These stresses may cause the connection between the connector 122 and the terminal 142 to be released, or the solder joints between the terminals 142 and the driving circuit substrates 121 may be damaged.

However, when two or more recess portions 1410 are formed in the edges of the body 141 within the central area (CA), the stress may be reduced or relieved by the increased flexibility. That is, the flexibility of the central area (CA) is increased by the recess portion 1410, such that the stresses generated in the central area (CA) may be reduced or minimized.

The recess portion 1410 includes two or more first recesses 1411 formed in one edge of the body 141 and two or more second recesses 1412 formed in the opposite edge of the body 141.

Figure 4:
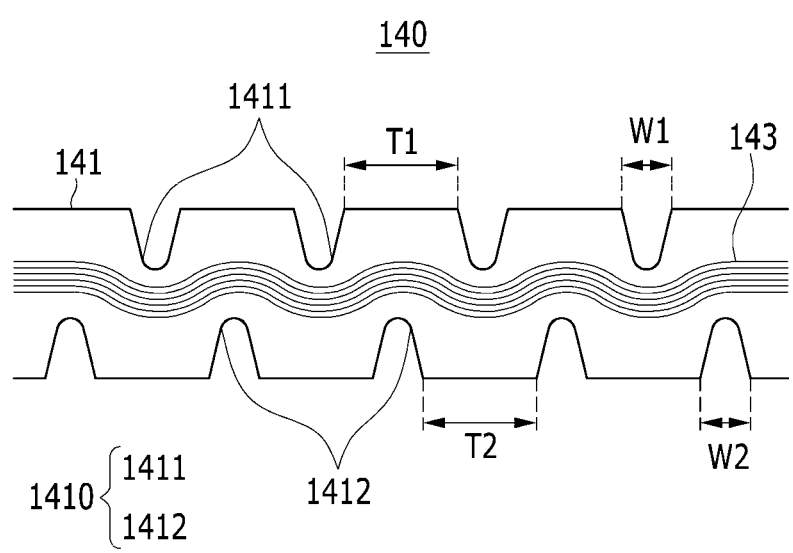
FIG. 4 is a drawing illustrating a central area of a conductive connecting member according to an exemplary embodiment.

FIG. 4 is a drawing illustrating further details of the central area (CA) of the conductive connecting member 140.

Referring to FIG. 4, the first recesses 1411 are formed to have a predetermined width W1 and a predetermined interval T1, and the second recesses 1412 are also formed to have a predetermined width W2 and a predetermined interval T2. The bottom surfaces of the first recesses 1411 and the second recesses 1412 may be rounded in, for example, a U- or V-shape. Further, the first recesses 1411 and the second recesses 1412 may be alternately disposed along the length direction of the body 141.

In the first exemplary embodiment, the first recesses 1411 and the second recesses 1412 are formed to each have the same size and shape (W1=W2), and adjacent first recesses 1411 and adjacent second recesses 1412 are respectively disposed to have the same interval therebetween (T1=T2). Accordingly, the stress applied to the central area (CA) may be relatively uniformly dispersed by the respective first recesses 1411 and respective second recesses 1412.

Figure 5:
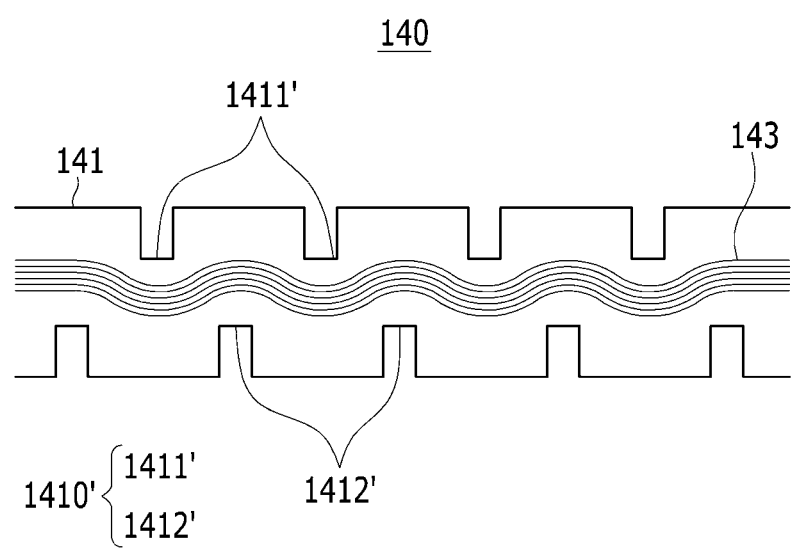
FIG. 5 is a drawing illustrating a central area of a conductive connecting member according to a first exemplary variation of FIG. 3.
Figure 6:
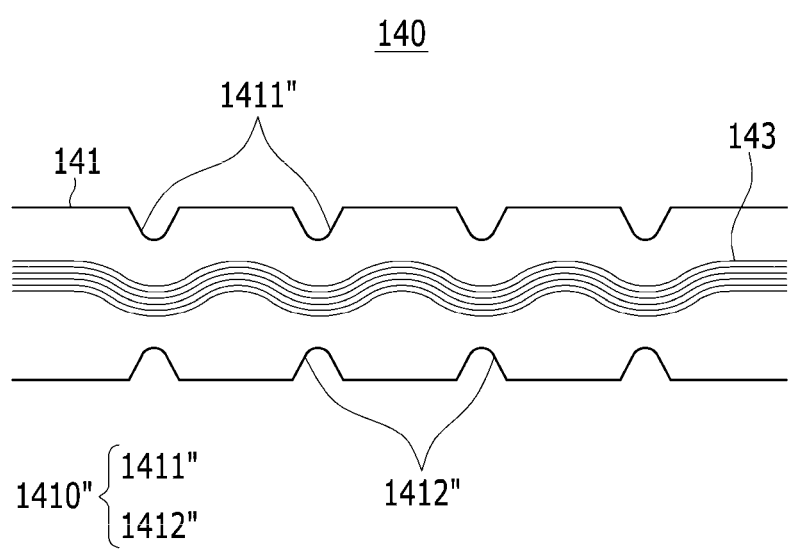
FIG. 6 is a drawing illustrating a central area of a conductive connecting member according to a second exemplary variation of FIG. 3.

FIG. 5 is a drawing illustrating a central area of a conductive connecting member according to a first exemplary variation of FIG. 3, and FIG. 6 is a drawing illustrating a central area of a conductive connecting member according to a second exemplary variation of FIG. 3.

Referring to FIG. 5, a conductive connecting member according to a first exemplary variation of FIG. 3 may include first recesses 1411' and second recesses 1412', the bottom surfaces of which have square shapes with straight edges. That is, the first recesses 1411' and the second recesses 1412' may have square or rectangular shapes, such as quadrangular slit shapes.

Referring to FIG. 6, a conductive connecting member according to a second exemplary variation of FIG. 3 may include first recesses 1411" and second recesses 1412" that are disposed to face each other based on the body 141.

That is, the shape, the number, and the disposition of the recess portions 1410, 1410', and 1410" in the central area (CA) may vary according to such factors as the geometry and structure of the display device, a direction in which the stress is substantially generated, combinations thereof, and the like. As such, the flexibility of the central area (CA) of the conductive connecting member may be improved by an FPCB structure having recess portions 1410 formed in the edges of the body 141 within the central area (CA), so that induced stresses are more effectively dispersed through the FPCB structure.

A conductive connecting member according to another exemplary embodiment will now be described with reference to FIG. 7. When describing this exemplary embodiment, a detailed description of like elements as those already described above will be omitted.

Figure 7:
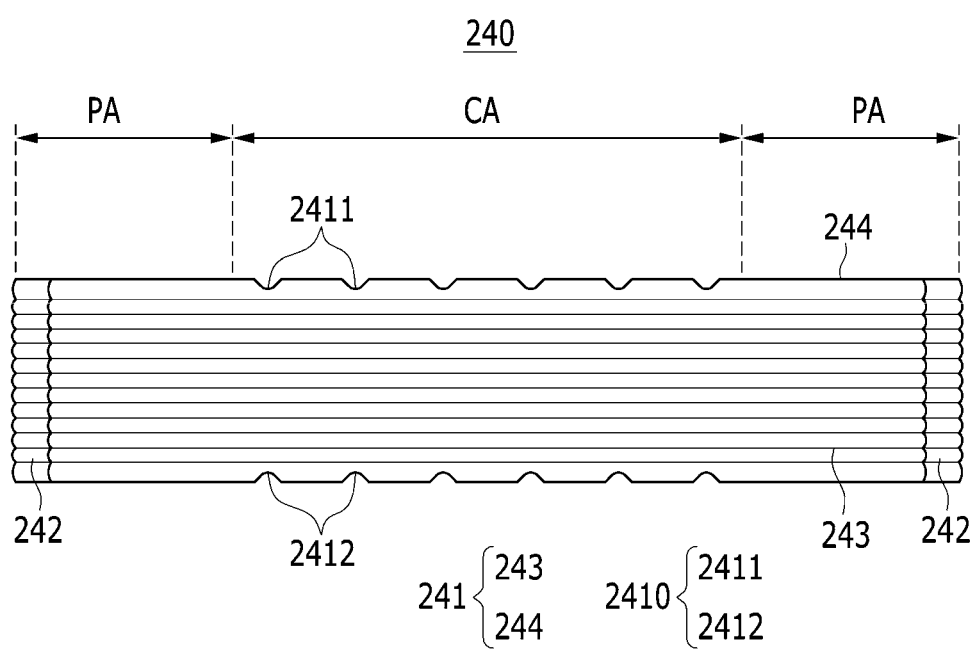
FIG. 7 is a schematic diagram of a conductive connecting member according to an exemplary embodiment.

FIG. 7 is a schematic diagram of the conductive connecting member 240 according to an exemplary embodiment.

Unlike the circuit pattern 143 being printed on the body 141 of the conductive connecting member 140, a body 241 of a conductive connecting member 240 may include two or more conductive wires 243 electrically connected to two terminals 242, and a protective member 244 wrapping and protecting the outside of the conductive wires 243. The conductive connecting member 240 according to this exemplary embodiment may be an FFC, but it is not limited thereto.

The protective member 244 may be formed of a material that may wrap around or surround the outside of the conductive wires 243 to electrically insulate the wires 243, such as a polyvinyl chloride (PVC) based compound, an olefin-based compound, or a thermoplastic elastomer (TPE).

Two or more recess portions 2410 are formed in an edge of the protective member 244. First recesses 2411 are formed in one edge of the protective member 244, and second recesses 2412 are formed in the opposite edge. However, although the recess portions 2410 are formed in the edges or sides of the protective member 244, the depth of the first recesses 2411 and the second recesses 2412 may be adjusted so that the conductive wires 243 are not exposed, as shown in FIG. 7.

The conductive wires 243 and the protective member 244 are flexible. In this exemplary embodiment, the conductive wires 243 and the protective member 244 are formed as a substantially straight or linear shape, to correspond to the linear body 241, but the shape of the body 241 may vary according to the geometry and structure of the display device 100.

For example, if the linear body 241 is folded in the two terminal areas (PA) thereof, the overall shape may be a U-shape similar to that of FIG. 2 described above.

As such, even when it is difficult to apply the above-described FPCB structure of the conductive connecting member 140 due to for example the inner structure and the wire design method of the display device 100, the conductive connecting member 240 according to this exemplary embodiment may still disperse or reduce stresses within the central area (CA) by increasing its flexibility.

Figure 8:
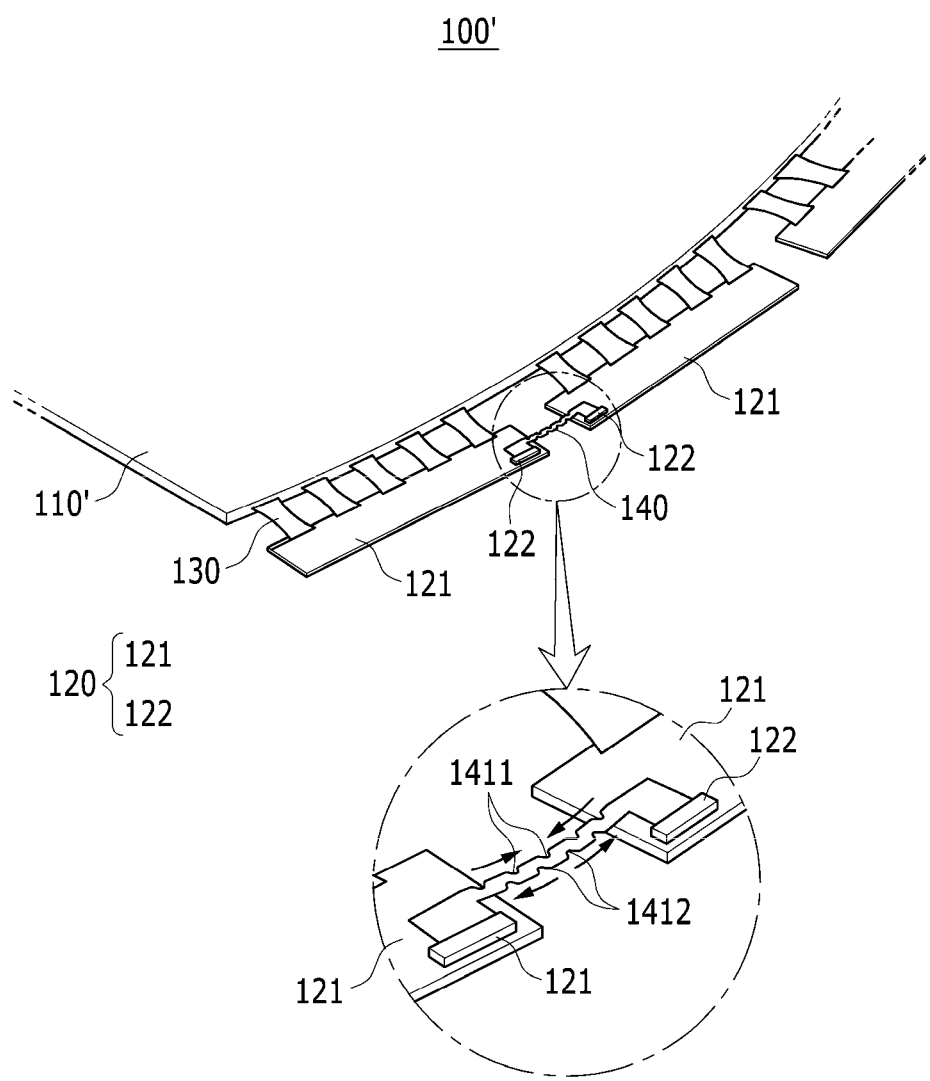
FIG. 8 is a perspective view of a curved display device including a conductive connecting member of an embodiment of the present invention.
Figure 9:
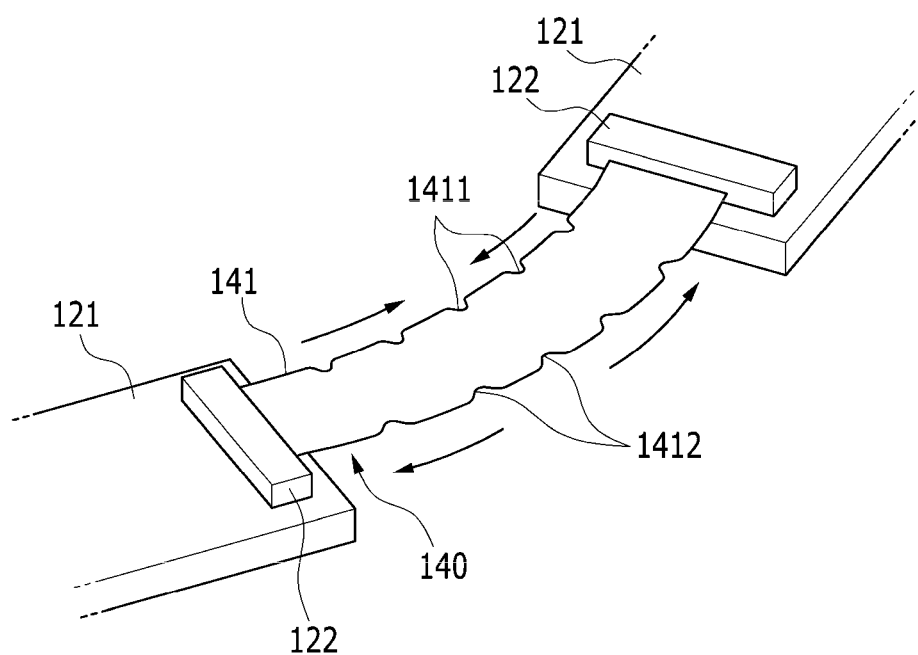
FIG. 9 is a perspective view in which an area of a conductive connecting member is enlarged in a curved display device including the conductive connecting member according to an exemplary variation of FIG. 3.

FIGS. 8 and 9 illustrate operation of the conductive connecting member 140. FIG. 8 is a perspective view of a curved display device 100' including the conductive connecting member 140 of FIGS. 1 and 2.

Compared to the display device 100 of FIG. 1 described above, the curved display device 100' includes a curved display panel 110' that is bent in a predetermined direction, and thus the driving circuit substrate 121 is curved and/or displaced to correspond to a curvature of the curved display panel 110', as shown in FIG. 8.

That is, since two or more driving circuit substrates 121 of the curved display device 100' are curved and disposed differently than in display device 100 of FIG. 1, the size and direction of the stress applied to the conductive connecting member 140 may also be changed.

More specifically, the stresses are applied to the conductive connecting member 140 in the direction of the arrows shown in FIG. 8. More specifically, bending imparts compressive stresses at the side of member 140 nearest to display device 100', and tensile stresses at the opposite side of member 140.

Accordingly, the first recesses 1411 are contracted, narrowed or compressed together due to the compressive stress, and the second recesses 1412 are stretched or widened due to the tensile stress.

FIG. 9 is a perspective view in which an area of the conductive connecting member is enlarged in the curved display device 100' including the conductive connecting member 140 according to the exemplary variation of FIG. 3.

Referring to FIG. 9, the conductive connecting member 140 includes a body 141 having a linear shape as shown in FIG. 3. Here, even when connectors 121 are mounted in a direction perpendicular to the length direction of the driving circuit substrate 121 so that receiving grooves (not shown) of adjacent connectors 121 face each other, the first recesses 1411 have a shape contracted or narrowed by the compressive stress and the second recesses 1412 have a shape widened by the tensile stress.

As such, the first recesses 1411 and the second recesses 1412 reduce stresses within the central area (CA) by increasing its flexibility. That is, since the flexibility of the central area (CA) is increased by the recess portion 1410, the reaction force applied toward the two terminal areas (PA) from the central area (CA) may be reduced, thereby effectively and substantially preventing the connection between the connector 122 and the terminal 142 from being damaged, or the solder or other joint between the terminal 142 and the driving circuit substrate 121 from being damaged.

While this disclosure has been described in connection with what is is presently considered to be practical exemplary embodiments, it is to be understood that the invention is not limited to the disclosed embodiments, but, on the contrary, is intended to cover various modifications and equivalent arrangements included within the spirit and scope of the appended claims. Furthermore, different features of the various embodiments, disclosed or otherwise understood, can be mixed and matched in any manner to produce further embodiments within the scope of the invention.

What is claimed is:

1. A conductive connecting member comprising:
    a flexible, elongated body;
    terminals formed at opposite ends of the body to be electrically connected to the body; and
    a circuit pattern disposed on the body,
    wherein the body includes terminal areas in which the terminals are formed and a central area disposed between the terminal areas,
    wherein two or more recess portions are formed in edges of the body within the central area of the body,
    wherein the recess portions include two or more first recesses formed in a first edge of the body, and two or more second recesses formed in a second edge of the body, the second edge being opposite to the first edge,
    wherein the first recesses are disposed in an alternating manner with the second recesses along the central area,
    wherein intervals between adjacent first recesses and intervals between adjacent second recesses are the same, and
    wherein the circuit pattern on the terminal area has a straight line shape and the circuit pattern on the central area has a curved line shape.

2. The conductive connecting member of claim 1, wherein:
    the recess portions comprise recesses in edges of the body, and at least one recess has a rounded end.

3. The conductive connecting member of claim 2, wherein:
    at least two of the recesses have a same width.

4. The conductive connecting member of claim 1, wherein:
    the terminal areas of the body each form an at least approximate U-shape.

5. The conductive connecting member of claim 1, wherein:
    the body forms a substantially linear shape in which the central area and the terminal areas extend substantially in the same direction.

6. A display device comprising:
    a display panel that is flexible and is constructed to display an image;
    a driver that includes two or more driving circuit substrates and is disposed around the display panel to drive the display panel;
    a flexible drive connector that electrically connects the display panel and the driver; and
    a conductive connecting member that electrically connects adjacent driving circuit substrates to each other,
    wherein the conductive connecting member includes a flexible elongated body, terminals formed at opposite ends of the body to be electrically connected to the body, and a circuit pattern disposed on the body,
    wherein the body includes terminal areas in which the terminals are formed and a central area disposed between the terminal areas, two or more recess portions are formed in edges of the body within the central area of the body, the recess portions include two or more first recesses formed in a first edge of the body, and two or more second recesses formed in a second edge of the body, the second edge being opposite to the first edge, the first recesses are disposed in an alternating manner with the second recesses along the central area, intervals between adjacent first recesses and intervals between adjacent second recesses are the same, and the circuit pattern on the terminal area has a straight line shape and the circuit pattern on the central area has a curved line shape.

7. The display device of claim 6, wherein:
    the display panel is a curved display panel curved in a predetermined direction, and
    the two or more driving circuit substrates are formed to be curved to correspond to a curvature of the curved display panel.

8. The display device of claim 7, wherein the driving circuit substrates include connectors sized and arranged to receive the terminals.

9. The display device of claim 8, wherein:
    the connectors are oriented substantially parallel to a lengthwise direction of the driving circuit substrate.

10. The display device of claim 8, wherein:
    the connectors are oriented substantially perpendicular to the lengthwise direction of the driving circuit substrate.

* * * * *